United States Patent
Lee et al.

(10) Patent No.: US 8,199,591 B2
(45) Date of Patent: Jun. 12, 2012

(54) DATA DRIVER

(75) Inventors: Dong Uk Lee, Gyeonggi-do (KR); Ji Yeon Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 427 days.

(21) Appl. No.: 12/494,381

(22) Filed: Jun. 30, 2009

(65) Prior Publication Data

US 2010/0142297 A1    Jun. 10, 2010

(30) Foreign Application Priority Data

Dec. 9, 2008  (KR) .................. 10-2008-0124494

(51) Int. Cl.
*G11C 7/00*   (2006.01)
(52) U.S. Cl. .................................. 365/198; 365/230.06
(58) Field of Classification Search .................. 365/198, 365/230.06; 326/30; 328/26
See application file for complete search history.

(56) References Cited

U.S. PATENT DOCUMENTS

| | | | |
|---|---|---|---|
| 6,087,853 A * | 7/2000 | Huber et al. ..................... | 326/83 |
| 6,531,911 B1 | 3/2003 | Hsu et al. | |
| 6,876,250 B2 | 4/2005 | Hsu et al. | |
| 7,138,823 B2 | 11/2006 | Janzen et al. | |
| 2003/0197525 A1* | 10/2003 | Song et al. ...................... | 326/30 |
| 2005/0248362 A1* | 11/2005 | Choe .............................. | 326/30 |
| 2006/0111865 A1 | 5/2006 | Choi | |
| 2006/0158214 A1 | 7/2006 | Janzen et al. | |
| 2006/0255829 A1* | 11/2006 | Kim et al. ....................... | 326/30 |
| 2007/0040574 A1 | 2/2007 | Janzen et al. | |

FOREIGN PATENT DOCUMENTS

| | | |
|---|---|---|
| JP | 10-255467 A | 9/1998 |
| KR | 1020020021450 A | 3/2002 |
| KR | 1020080102892 A | 11/2008 |

* cited by examiner

*Primary Examiner* — Vu Le
(74) *Attorney, Agent, or Firm* — Ladas & Parry LLP

(57) ABSTRACT

A data driver is presented in which the data driver includes a termination/pull-up driver and a pull-down driver. The termination/pull-up driver is configured to perform a termination operation and a pull-up operation at the same time for a data output terminal during an active interval of a semiconductor memory. The pull-down driver is configured to be activated when the semiconductor memory performs a read operation, and configured to pull down the output terminal in response to a level of an input data.

9 Claims, 9 Drawing Sheets

DATA DRIVER

CROSS-REFERENCES TO RELATED PATENT APPLICATION

The present application claims priority under 35 U.S.C 119(a) to Korean Application No. 10-2008-0124494, filed on Dec. 9, 2008, in the Korean Intellectual Property Office, which is incorporated herein by reference in its entirety as set forth in full.

BACKGROUND

1. Technical Field

The present invention described herein relates to a semiconductor circuit and, more particularly, to a data driver.

2. Related Art

Semiconductor circuit devices such as a dynamic random access memory (DRAM) and a controller controlling the same such as a graphic processing unit (GPU) or a central processing unit (CPU) are provided with interface circuits for transmitting and receiving data to and from each other.

The interface circuits are provided with a data driver for driving the data so as to transmit the data through a transmission line.

The interface circuit is an essential component for determining a data transmission performance between different components that transmits and receives data. An operational performance of the data driver has a large influence on a performance of the interface circuit.

Accordingly, development of a data driver that can reduce a load and improve a data transmission speed is required.

SUMMARY

A data driver that can reduce driving hindering elements and improve a data input/output speed is disclosed herein.

In one embodiment, a data driver includes a termination/pull-up driver configured to perform a termination operation and a pull-up operation at the same time for a data output terminal during an active interval of a semiconductor memory; a pull-down driver configured to be activated when the semiconductor memory performs a read operation, and pull down the output terminal in response to a level of an input data.

In another embodiment, a data driver includes a first driver configured to terminate a data output terminal with a predetermined resistance value in response to a termination control signal; and a second driver configured to pull down the data output terminal in response to a level of a output control signal and a level of an input data, wherein the termination control signal is activated regardless of a read operation interval and a write operation interval and the output control signal is activated during the read operation interval.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
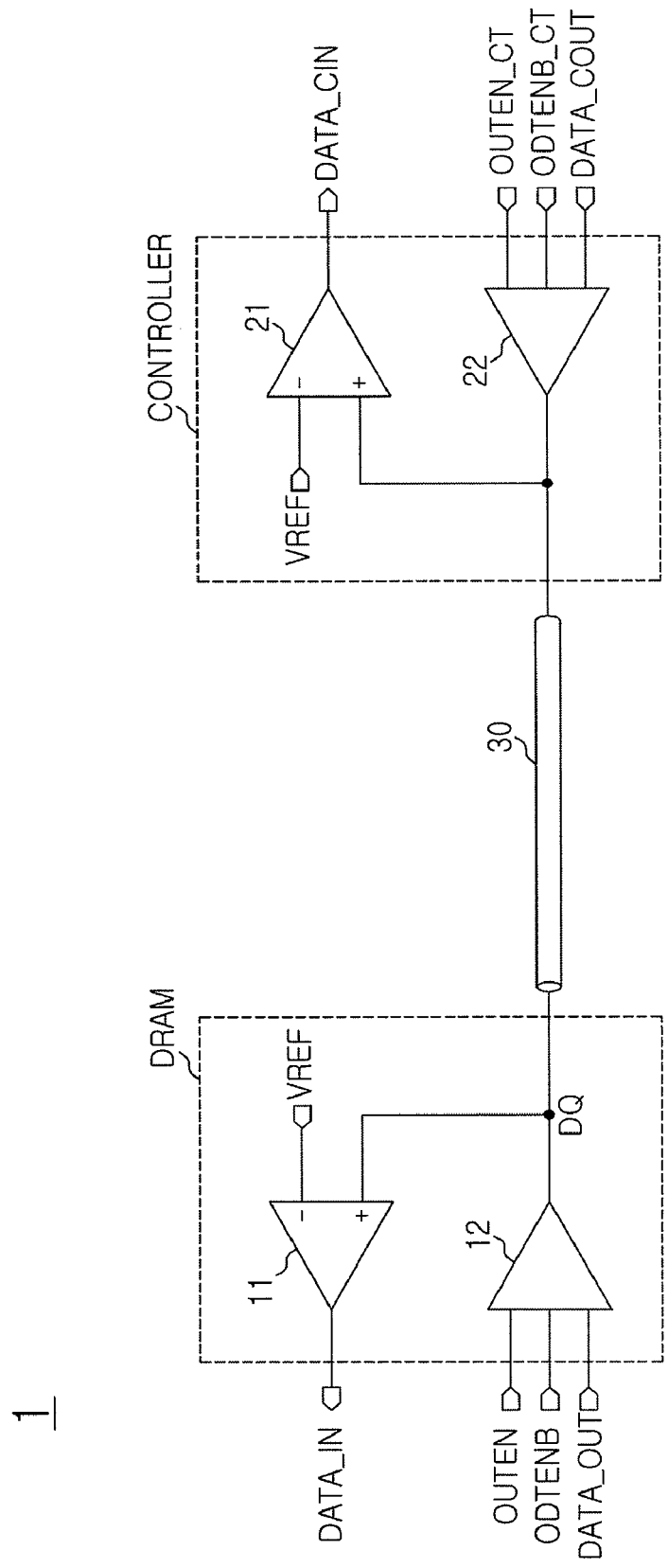
FIG. 1 is a block diagram of an exemplary data input/output interface circuit according to one embodiment.

FIG. 1 is a block diagram of an exemplary data input/output interface circuit according to one embodiment.

As shown in FIG. 1, the data input/output interface circuit 1 can be configured to include a data receiver 11 and a data driver 12 that are provided in a DRAM and a data receiver 21 and a data driver 22 that are provided in a controller. The DRAM and the controller are connected to each other through a data transmission line 30.

The data receivers 11 and 21 are configured to receive data transmitted from the other party and the data drivers 12 and 22 are configured to output the data to the other party.

Figure 2:
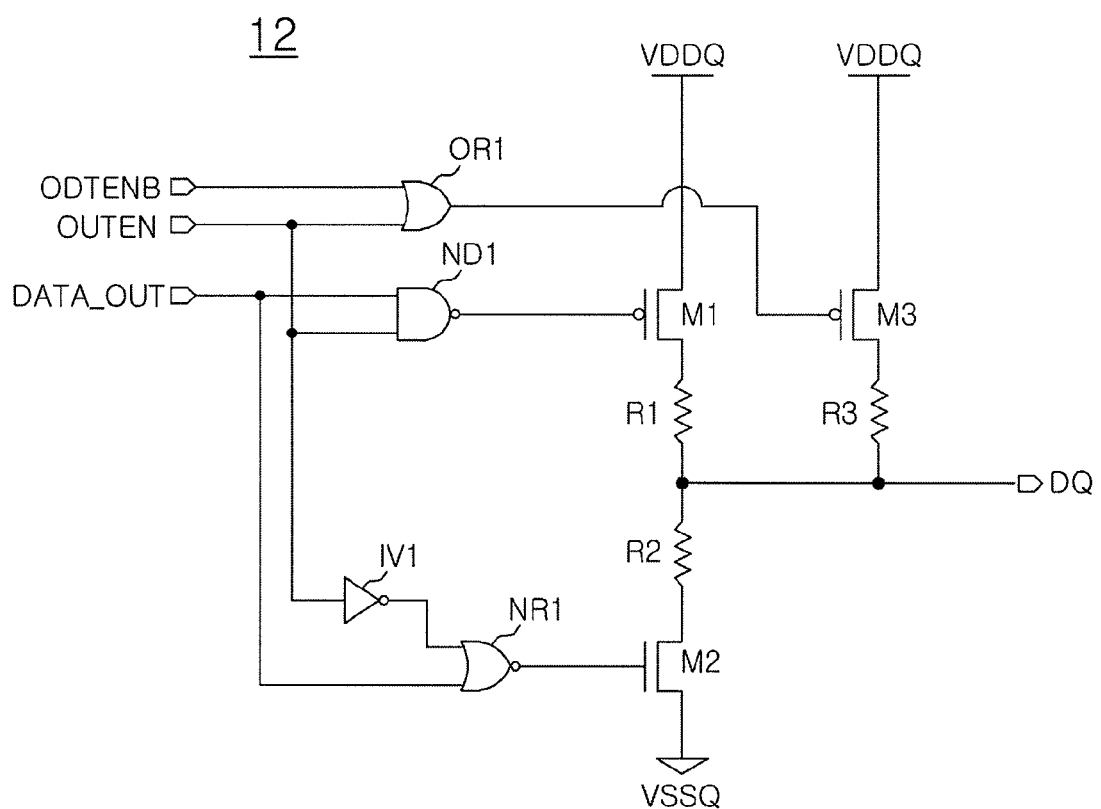
FIG. 2 is a circuit diagram of an exemplary data driver that can be included with the circuit of FIG. 1 according to one embodiment.

FIG. 2 is a circuit diagram of an exemplary data driver that can be included with the circuit of FIG. 1 according to one embodiment.

The data driver 12 that is provided in the DRAM and the data driver 22 that is provided in the controller can have the same configuration. As shown in FIG. 2, the data driver 12 can include an OR gate OR1, a NAND gate ND1, an inverter IV1, a NOR gate NR1, first to third transistors M1 to M3, and first to third resistors R1 to R3.

The data driver 12 performs a data pull-up operation or a data pull-down operation by using a pull-up transistor and a pull-down transistor, that is, the first and second transistors M1 and M2 when an output control signal 'OUTEN' is activated.

Meanwhile, the data driver 12 can terminate an input/output terminal DQ with predetermined impedance according to the third transistor M3 when a termination control signal 'ODTENB' is activated.

Figure 3:
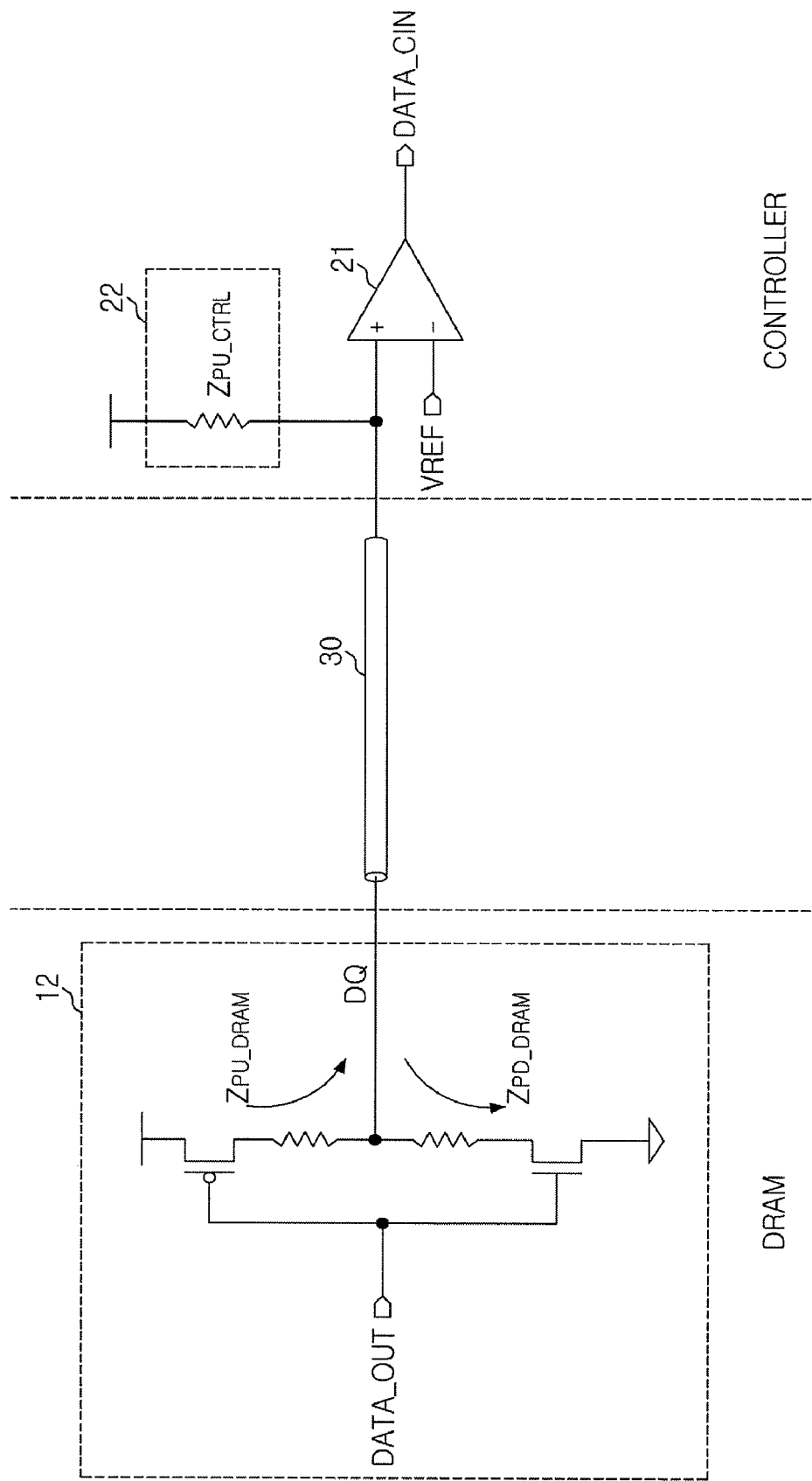
FIG. 3 is a schematic circuit diagram when a data input/output interface circuit performs a read operation according to one embodiment.

FIG. 3 is a schematic circuit diagram when a data input/output interface circuit performs a read operation according to one embodiment.

When the DRAM performs the read operation, the output control signal 'OUTEN' and a termination control signal 'ODTENB_CT' are activated and an output control signal 'OUTEN_CT' and the termination control signal 'ODTENB' are deactivated.

Accordingly, the data driver 12 in the DRAM and the data driver 21 in the controller operate and the data receiver 11 in the DRAM does not operate and the data driver 22 in the controller operates as a termination resistor.

Therefore, in FIG. 2, the data driver 12 in the DRAM can output the data to the data transmission line 30 by driving the data in accordance to a pull-up impedance 'ZPU_DRAM' and a pull-down impedance 'ZPD_DRAM' and the data driver 22 in the controller can perform a termination operation for the data transmission line 30 in accordance to the pull-up impedance 'ZPU_CTRL'.

Figure 4:
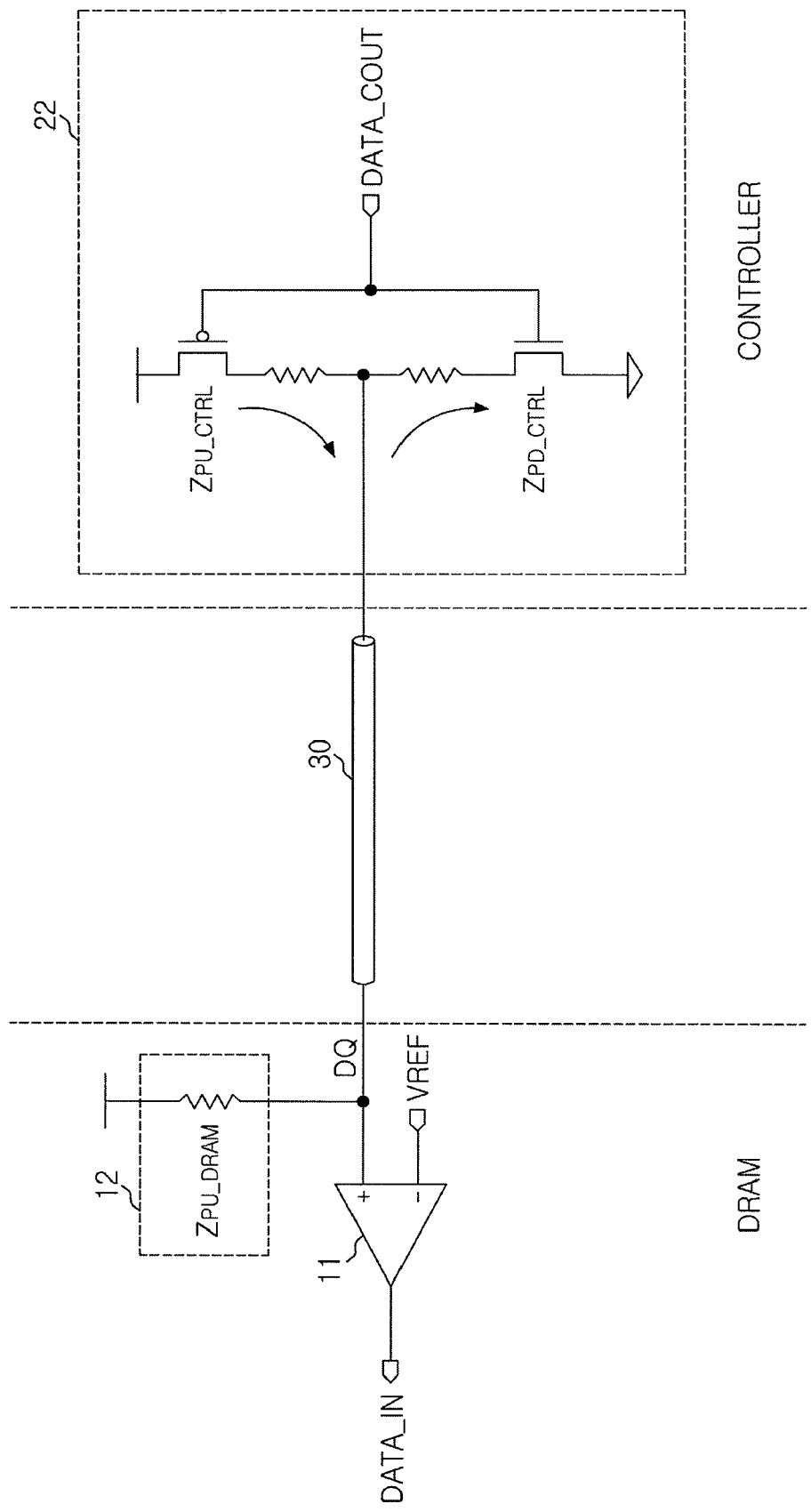
FIG. 4 is a schematic circuit diagram when a data input/output interface circuit performs a write operation according to one embodiment.

FIG. 4 is a schematic circuit diagram when a data input/output interface circuit performs a write operation according to one embodiment.

When the DRAM performs the write operation, the output control signal 'OUTEN' and the termination control signal 'ODTENB_CT' are deactivated and the output control signal 'OUTEN_CT' and the termination control signal 'ODTENB' are activated.

Accordingly, the data driver 22 in the controller and the data receiver 11 in the DRAM operate and the data receiver 21 in the controller does not operate and the data driver 12 in the DRAM operates as the termination resistor.

Therefore, in FIG. 2, the data driver 12 in the DRAM can perform a termination operation for the data transmission line 30 in accordance to the pull-up impedance 'ZPU_DRAM' and the data driver 22 in the controller can output the data to the data transmission line 30 by driving the data in accordance to the pull-up impedance 'ZPU_CTRL' and a pull-down impedance 'ZPD_CTRL'.

Figure 5:
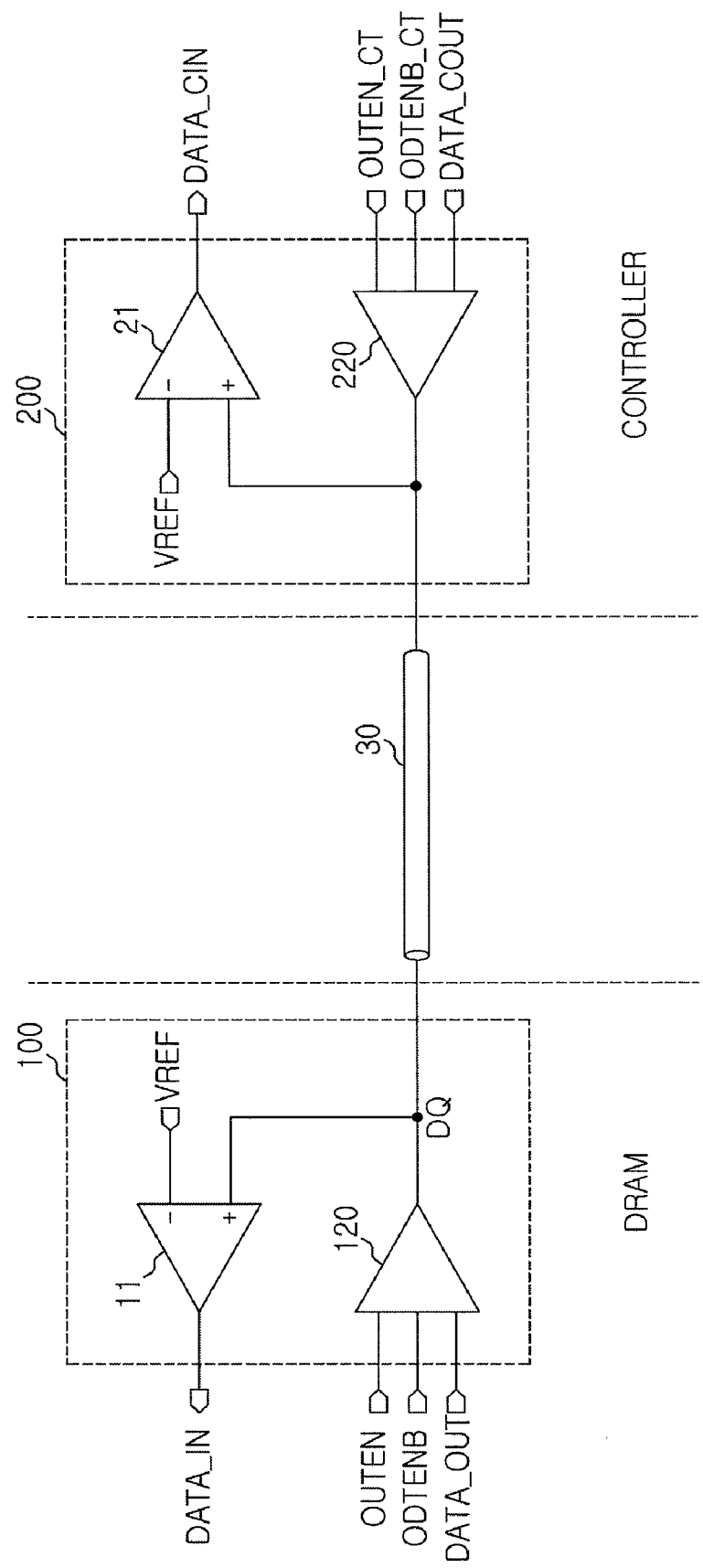
FIG. 5 is a block diagram of an exemplary data input/output interface circuit according to another embodiment.

FIG. 5 is a block diagram of an exemplary data input/output interface circuit according to another embodiment.

The data input/output interface circuit 2 can include a first interface circuit unit 100, a second interface circuit unit 200, and a data transmission line 30 as shown in FIG. 5.

The first interface circuit unit 100 can be included in a semiconductor memory such as a dynamic random access memory (DRAM) and can include a first data receiver 11 and a first data driver 120.

The first data receiver 11 is deactivated when the DRAM performs a read operation (hereinafter, referred to as 'read operation') and activated when the DRAM performs a write operation (hereinafter, referred to as 'write operation'), such that the first data receiver 11 is configured to receive data from the second interface circuit unit 200 through the data transmission line 30.

The first data driver 120 is configured to pull up the data transmission line 30 by activating a termination function regardless of the read and write operations by using a termination control signal 'ODTENB' and configured to pull down the data transmission line 30 in accordance to the level of output data 'DATA_OUT' during the read operation.

The second interface circuit unit 200 can be included in a controller for controlling data input/output of the DRAM and can be configured to include a second data receiver 21 and a second data driver 220.

The second data receiver 21 is deactivated during the write operation and activated during the read operation, such that the second data receiver 21 is configured to receive the data from the first interface circuit unit 100 through the data transmission line 30.

The second data driver 220 is configured to pull up the data transmission line 30 by activating the termination function regardless of the read and write operations by using a termination control signal 'ODTENB_CT' and configured to pull down the data transmission line 30 in accordance to the level of output data 'DATA_COUT' during the write operation.

The first data receiver 11 and the second data receiver 21 can have the same configuration as FIG. 1.

The first data receiver 120 and the second data receiver 220 can have the same circuit configuration except for different sources of inputted signals.

Figure 6:
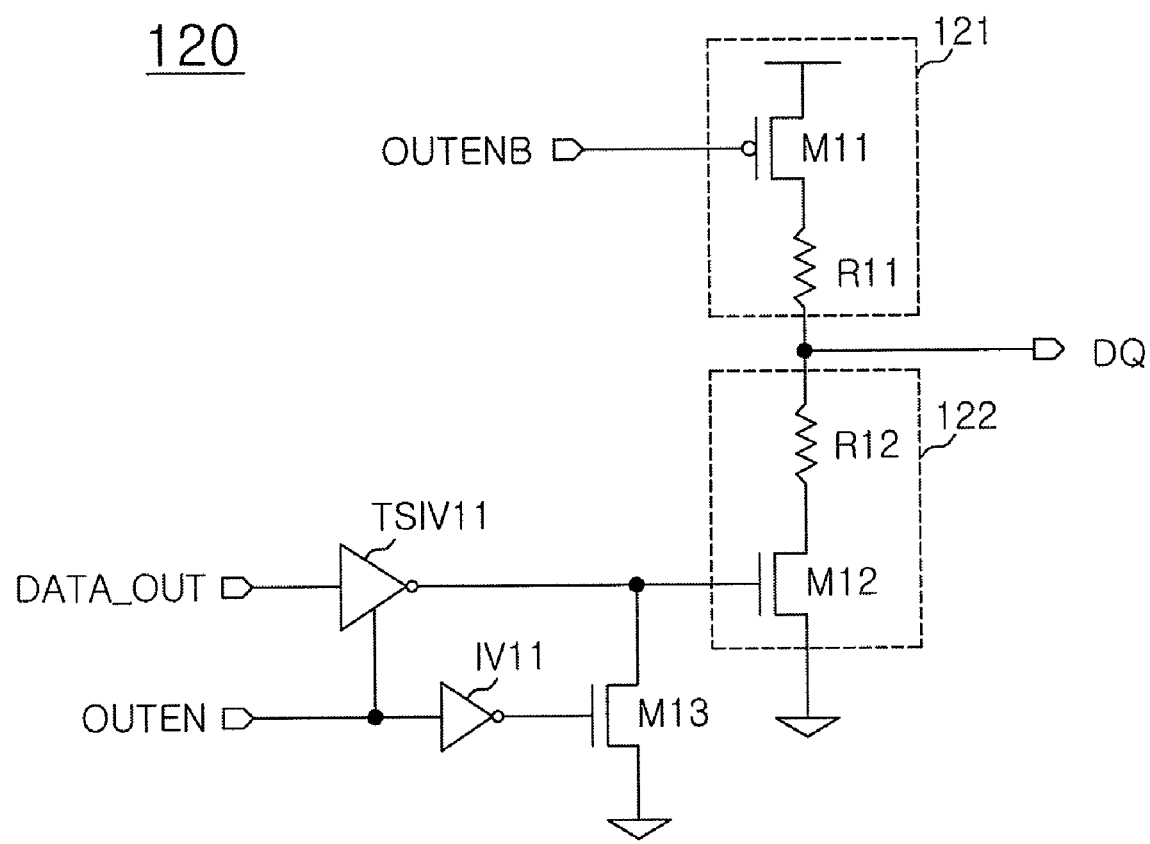
FIG. 6 is a circuit diagram of an exemplary data driver that can be included with the circuit of FIG. 5 according to another embodiment.

FIG. 6 is a circuit diagram of an exemplary data driver that can be included with the circuit of FIG. 5 according to another embodiment.

The first data driver 120 can include a first driver 121 that is used for both termination and pull-up, a second driver 122 that is used as a pull-down driver, a first switching element TSIV11, an inverter IV11, and a second switching element M13 as shown in is FIG. 6.

The first driver 121 can include a first transistor M11 and a first resistor R11. The first driver 121 is configured to pull up the data transmission line 30 to the level of a power supply terminal VDDQ by maintaining an activation state in response to a termination control signal 'ODTENB' and terminate the data transmission line 30 with a resistance value summing up a channel resistance value of the first transistor M11 and a resistance value of the first resistor R11.

The termination control signal 'ODTENB' is generated so as to maintain the activation state regardless of the read operation and the write operation, that is, throughout an active interval by the DRAM.

Meanwhile, a PMOS type transistor generally has a response speed slower than an NMOS type transistor. Therefore, when the PMOS type transistor is switched from a turn-off state to a turn-on state, the PMOS type transistor has a larger size than the NMOS type transistor in order to pull up an input/output terminal DQ to the level of the power supply terminal VDDQ.

However, the PMOS type transistor shown in FIG. 6, that is, the first transistor M11 maintains the state in which the data transmission line 30 is pulled up to the level of the power supply terminal VDDQ in response to the termination control signal 'ODTENB' for maintaining the activation state regardless of the read operation and the write operation. Therefore, the first transistor M11 does not have a larger size than the NMOS type transistor, that is, a second transistor M12 of the second driver 122.

The second driver 122 can include the second transistor M12 and a second resistor R12. The second driver 122 is configured to pull down the data transmission line 30 in response to the level of the output data 'DATA_OUT' inputted through the first switching element TSIV11 when the output control signal 'OUTEN' is activated.

The second switching element M13 is configured to deactivate the second driver 122 in response to a deactivation of the output control signal 'OUTEN' during the write operation.

Meanwhile, the termination control signal 'ODTENB_CT' inputted into the second interface circuit unit 200 is also generated to maintain the activation state regardless of the read operation and the write operation, that is, throughout an active interval by the controller. Therefore, referring to FIG. 5, the second data driver 220 of the second interface circuit unit 200 also terminates the data transmission line 30 while pulling up the data transmission line 30 to the level of the power supply terminal VDDQ by continuously maintaining the activation state in response to the termination control signal 'ODTENB_CT'.

Hereinafter, an operation of the data input/output interface circuit will be described below.

Figure 7:
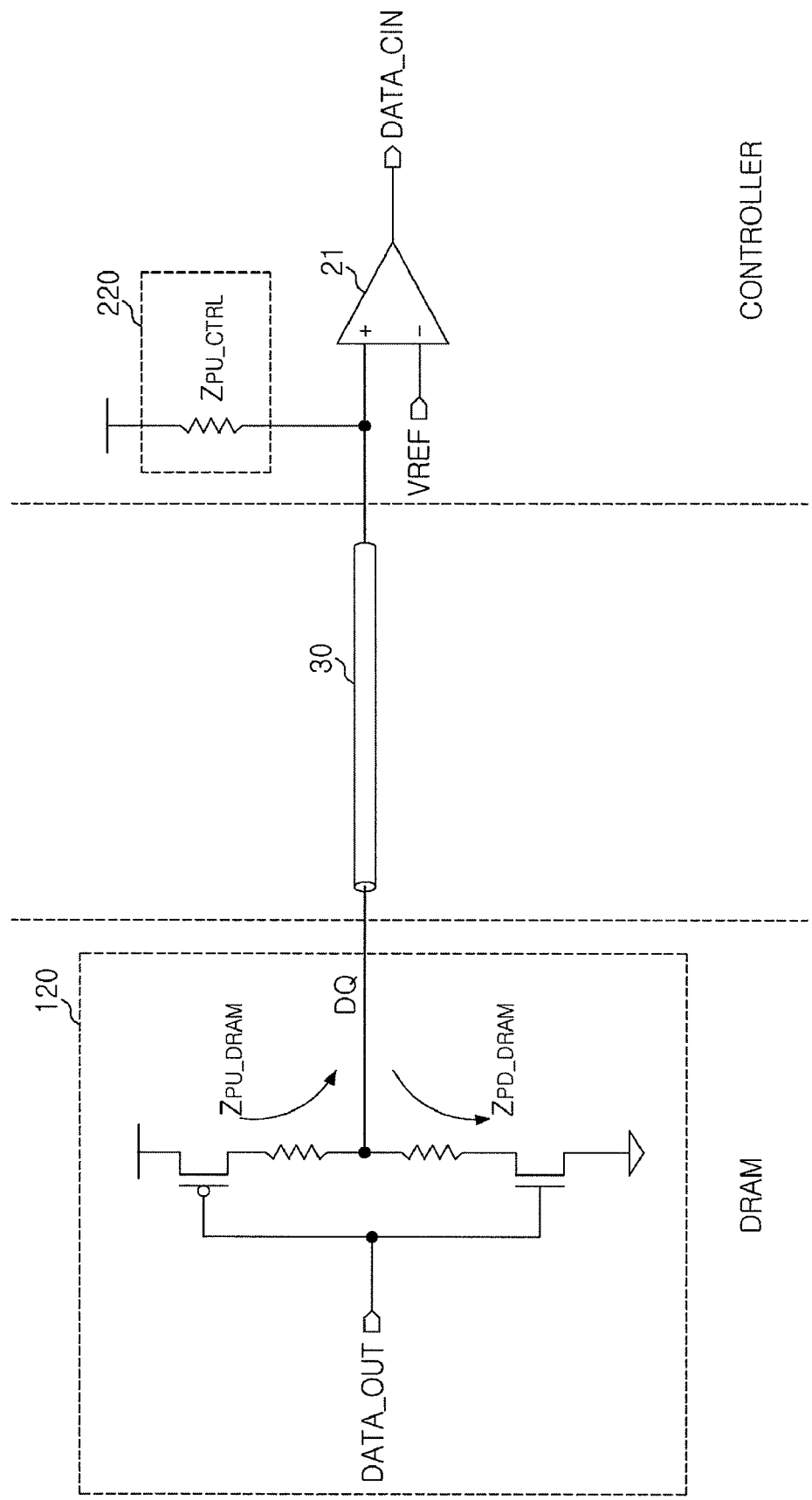
FIG. 7 is a schematic circuit diagram when a data input/output interface circuit performs a read operation according to another embodiment.
Figure 8:
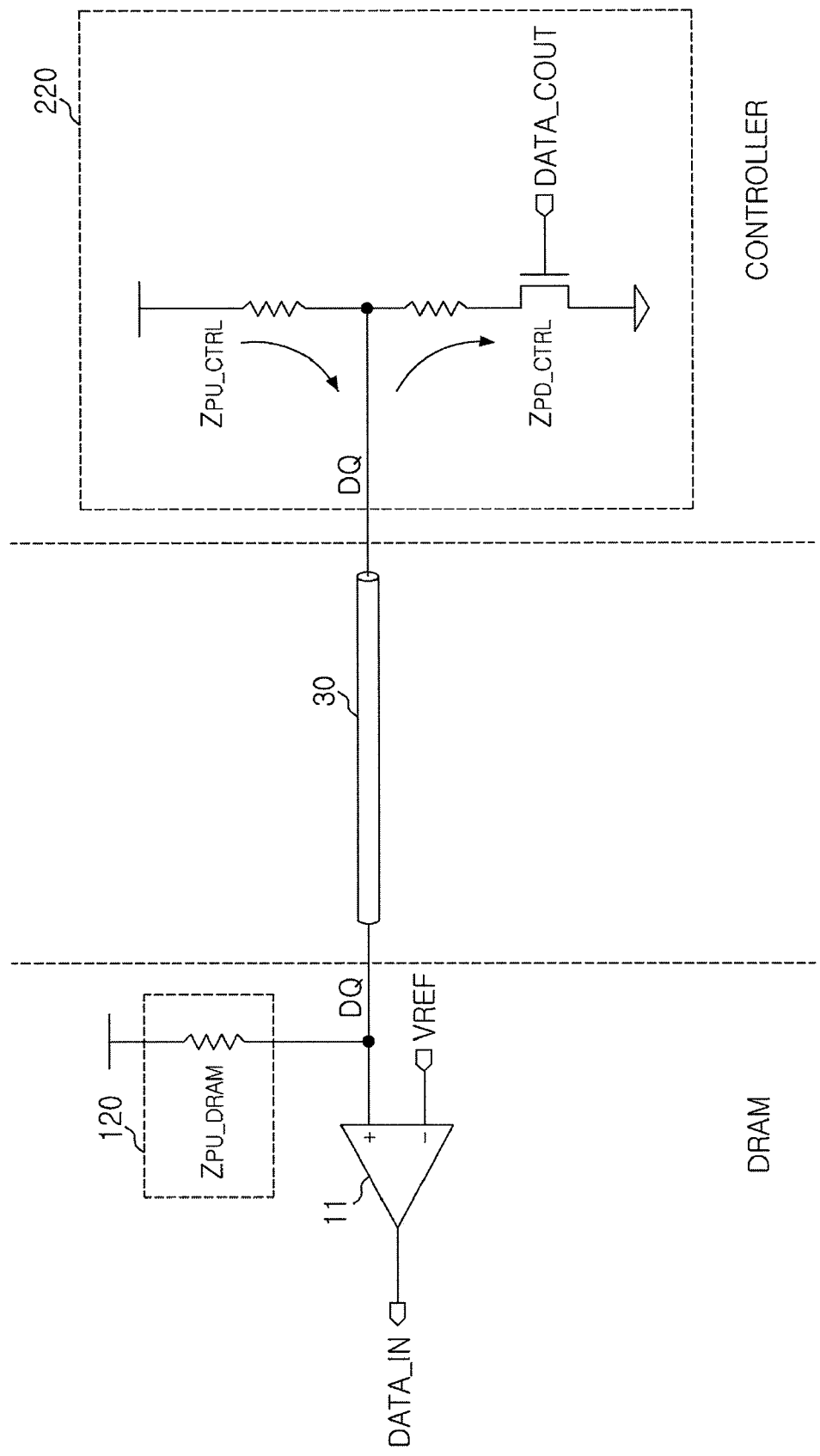
FIG. 8 is a schematic circuit diagram when a data input/output interface circuit performs a write operation according to another embodiment.
Figure 9:
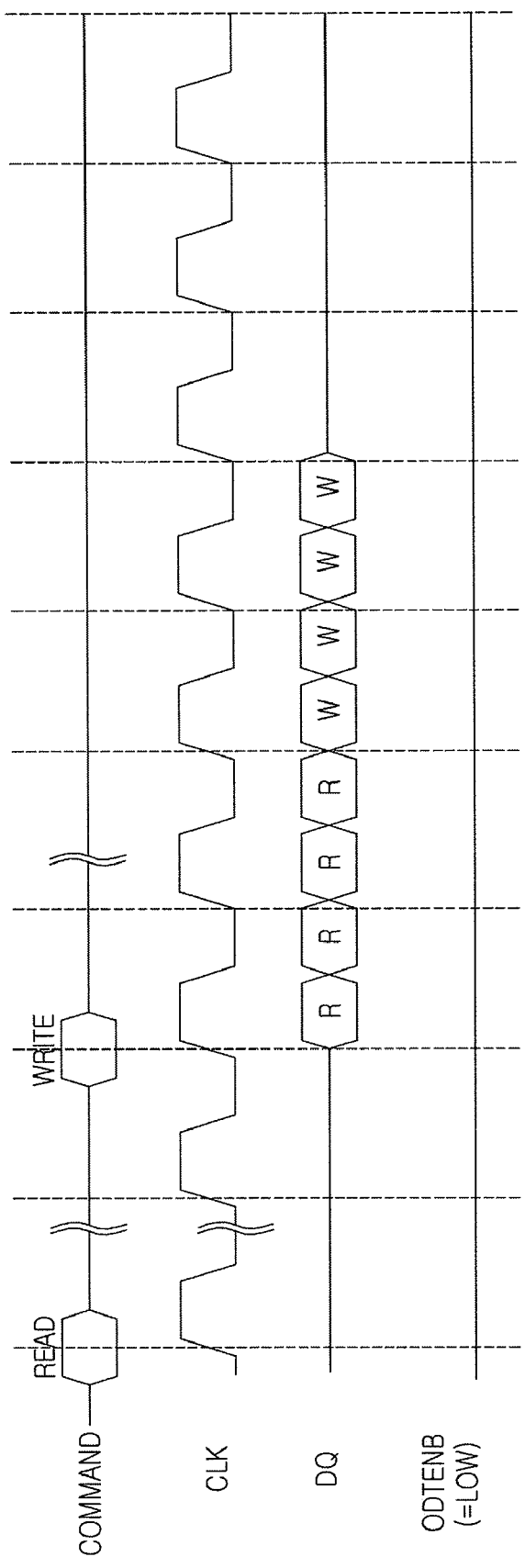
FIG. 9 is a read/write operation timing diagram of an exemplary data input/output interface circuit according to another embodiment.

FIG. 7 is a schematic circuit diagram when a data input/output interface circuit performs a read operation according to another embodiment, FIG. 8 is a schematic circuit diagram when a data input/output interface circuit performs a write operation according to another embodiment, and FIG. 9 is a read/write operation timing diagram of an exemplary data input/output interface circuit according to another embodiment.

During the read operation, the output control signal 'OUTEN' of the first interface circuit unit 100 is activated and the output control signal 'OUTEN_CT' of the second interface circuit unit 200 is deactivated. Further, during the read operation, a first receiver 11 is deactivated and a second receiver 21 is activated. Of course, the termination control signals 'ODTENB' and 'ODTENB_CT' maintain the activation state regardless of the read operation and the write operation as shown in FIG. 9.

The first data driver 120 and the second data driver 220 maintain the data transmission line 30 in a pull-up state in response to the termination control signals 'ODTENB' and 'ODTENB_CT'.

Since the output control signal 'OUTEN' is activated and the output control signal 'OUTEN_CT' is deactivated, the first data driver 120 pulls down the data transmission line 30 in response to the output data 'DATA_OUT', while the second data driver 220 performs only the termination function without performing a driving operation.

During the read operation, the first interface circuit unit 100 and the second interface circuit unit 200 are shown in FIG. 7.

As seen from FIG. 7, the voltage level (hereinafter, referred to as '$V_{OL}$') of low data outputted while the interface circuit performs the read operation is $[Z_{PD\_DRAM}/Z_{PD\_DRAM}+(Z_{PU\_DRAM}//Z_{PU\_CTRL})]*VDDQ$.

Meanwhile, during the write operation, the output control signal 'OUTEN' of the first interface circuit unit 100 is deactivated and the output control signal 'OUTEN_CT' of the second interface circuit unit 200 is activated. Further, during the write operation, the first receiver 11 is activated and the second receiver 21 is deactivated. Of course, the termination control signals 'ODTENB' and 'ODTENB_CT' maintain the activation state regardless of the read operation and the write operation as shown in FIG. 9.

The first data driver 120 and the second data driver 220 maintain the data transmission line 30 in the pull-up state in response to the termination control signals 'ODTENB' and 'ODTENB_CT'.

Since the output control signal 'OUTEN' is deactivated and the output control signal 'OUTEN_CT' is activated, the second data driver 220 pulls down the data transmission line 30 in response to the output data 'DATA_COUT', while the first data driver 120 performs only the termination function without performing the driving operation.

During the write operation, the first interface circuit unit 100 and the second interface circuit unit 200 are shown in FIG. 8.

As seen from FIG. 8, the voltage level (hereinafter, referred to as '$V_{IL}$') of low data outputted while the interface circuit performs the write operation is $[Z_{PD\_CTRL}/Z_{PD\_CTRL}+(Z_{PU\_DRAM}//Z_{PU\_CTRL})]*VDDQ$.

An interface circuit can optimize a load of a data driver so as to improve an operational performance of the interface circuit during both a read operation and a write operation.

Further, since the interface circuit operates in a scheme to maintain a termination function in an activation state regardless of a read command and a write command, the interface circuit does not need an additional timing margin as shown in FIG. 9.

Accordingly, since a controller can be quick to consecutively input the read command and the write command or consecutively input the write command and the read command into a DRAM, data is also inputted and outputted with fast timing.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A data driver, comprising:
   a termination/pull-up driver configured to simultaneously perform a termination operation and a pull-up operation for a data output terminal during an active interval of a semiconductor memory regardless of an input data; and
   a pull-down driver configured to be activated when the semiconductor memory performs a read operation, and configured to pull down the output terminal in response to a level of the input data.

2. The data driver of claim 1, further comprising:
   a first switching element configured to pass the input data in response to an output control signal; and
   a second switching element configured to deactivate the pull-down driver in response to the output control signal.

3. The data driver of claim 2, wherein the termination/pull-up driver includes:
   a resistance element connected to the data output terminal; and
   a PMOS type transistor configured to be activated in response to a termination control signal by being connected between the resistance element and a power supply terminal.

4. The data driver of claim 3, wherein the termination control signal maintains an activation state during the active interval of the semiconductor memory.

5. The data driver of claim 2, wherein the pull-down driver includes:
   a resistance element connected to the data output terminal; and
   an NMOS type transistor configured to be activated in response to the input data by being connected between the resistance element and a ground terminal.

6. A data driver, comprising:
   a first driver configured to terminate a data output terminal with a predetermined resistance value in response to a termination control signal regardless of an input data; and
   a second driver configured to pull down the data output terminal in response to a level of a output control signal and in response to a level of the input data,
   wherein the termination control signal is activated during a read operation interval and a write operation interval
   wherein the output control signal is activated during the read operation interval.

7. The data driver of claim 6, further comprising:
   a first switching element configured to pass the input data in response to the output control signal; and
   a second switching element configured to deactivate the second driver in response to the output control signal.

8. The data driver of claim 7, wherein the first driver includes:
   a resistance element configured to be connected to the data output terminal; and a PMOS type transistor configured to be activated according to the termination control signal by being connected between the resistance element and a power supply terminal.

9. The data driver of claim 7, wherein the second driver includes:

a resistance element connected to the data output terminal; and an NMOS type transistor configured to be activated in response to the input data by being connected between the resistance element and a ground terminal.

* * * * *